United States Patent [19]

Kimura et al.

[11] Patent Number: 4,719,161

[45] Date of Patent: Jan. 12, 1988

[54] MASK FOR X-RAY LITHOGRAPHY AND PROCESS FOR PRODUCING THE SAME

[75] Inventors: Takeshi Kimura; Kozo Mochiji; Hiroshi Okamoto; Takao Iwayanagi; Tetsuichi Kudo; Shinji Kuniyoshi, all of Tokyo, Japan

[73] Assignee: Hitachi, Ltd., Tokyo, Japan

[21] Appl. No.: 893,780

[22] Filed: Aug. 6, 1986

[30] Foreign Application Priority Data

Aug. 16, 1985 [JP] Japan ................. 60-179422

[51] Int. Cl.$^4$ ................................. G03F 9/00
[52] U.S. Cl. ........................ 430/5; 430/296;
430/325; 430/327; 430/330; 430/966; 430/947;
430/942; 378/35
[58] Field of Search ............ 430/5, 321, 966, 942,
430/296, 947; 378/34, 35; 250/492.3

Primary Examiner—John E. Kittle
Assistant Examiner—José G. Dees
Attorney, Agent, or Firm—Antonelli, Terry & Wands

[57] ABSTRACT

There is disclosed a mask for X-ray lithography wherein a peroxopolytungsten compound is used as an absorber, and a process for producing the same. Since this compound has a sensitivity for electron beams and light and serves as an absorber for X-rays, a mask for X-ray lithography is made only by applying this compound to a substrate, exposing the same to light to form a transferred pattern, and effecting development. Thus, the step of etching the absorber which is essential in the conventional process, is not needed. Therefore, masks having a highly accurate pattern and few defects can be produced with a high production yield.

6 Claims, 10 Drawing Figures

MASK FOR X-RAY LITHOGRAPHY AND PROCESS FOR PRODUCING THE SAME

BACKGROUND OF THE INVENTION

The present invention relates to a mask for X-ray lithography used in the X-ray lithography technique, and a process for readily producing a mask for X-ray lithography having a high contrast for X-rays with a high accuracy.

The basic structure of the mask for X-ray lithography comprises a membrane 2 made of a material capable of transmitting soft X-rays and supported therearound by a ring 1, and a pattern 3 made of a material hardly capable of transmitting soft X-rays and formed on the membrane, as shown in FIG. 1. A pattern as mentioned above has heretofore been formed according to a process, as shown in FIG. 2(a), which comprises forming a multi-layer resist pattern 24 on a pattern material 23 capable of absorbing X-rays, such as gold, tantalum or tungsten, and subjecting this material 23 to dry processing with the multi-layer resist pattern 24 as a mask, or a process, as shown in FIG. 2(b), which comprises depositing gold 23' as an X-ray absorber in recessed portions of a multi-layer resist pattern 24' formed on a membrane by an electrolytic plating method (see A. R. Shimkunas, Solid State Technology, September 1984, p. 192–199). In either method, however, the manufacturing process is complicated with liability to cause a pattern defect and have a weak point for pattern accuracy, since the multi-layer process is involved.

SUMMARY OF THE INVENTION

An object of the present invention is to provide a high-accuracy mask for X-ray lithography and a process for producing the same with a high production yield.

The prime object of the present invention is to propose a process for producing a simple and high-accuracy mask for X-ray lithography by using as a material for forming an X-ray absorbing pattern as mentioned above a peroxopolytungsten compound containing tungsten, or tungsten and other heavy metal(s) and having a sensitivity for electron beams and/or light without using any conventional multi-layer process.

The above-mentioned polytungsten compound can be applied to a silicon wafer by spin-coating. Further, since it contains tungsten as the main component, the resulting pattern can be used as such as a soft X-ray absorber.

Although the multi-layer process has heretofore been employed in forming an X-ray absorbing pattern, not only is the process complicated but also the dimensional accuracy of the pattern is poor with many defects because two steps of gold pattern formation and pattern conversion are involved. In contrast, according to the present invention, since a pattern formed by electron beam drawing (pattern formed from a peroxopolytungsten compound) is used as such as an X-ray absorbing pattern, not only can the number of steps in the manufacture be largely decreased with a high production yield, but also the dimensional accuracy of the pattern can be remarkably improved.

Beside the mask for X-ray lithography, needless to say, the present invention is effective in application thereof to a photomask instead of a thin chrome film usually used.

DETAILED DESCRIPTION OF THE PRESENTLY PREFERRED EMBODIMENTS

Example 1

Figure 1:
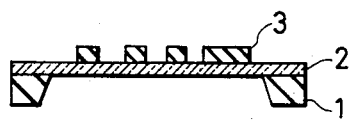
FIGS. 1, 2a, 2b, are diagrams showing the prior art technique.
Figure 2A:
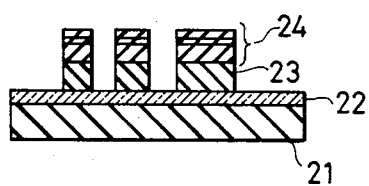
Figure 2B:
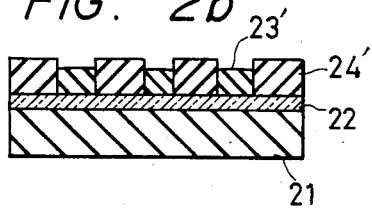
Figure 3A:
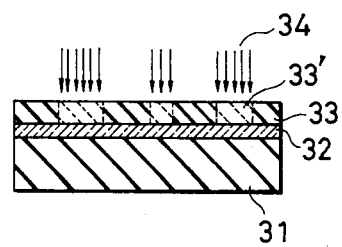
FIGS. 3a, 3b, 3c, 4a, 4b, 4c, and 4d are diagrams showing examples.
Figure 3B:
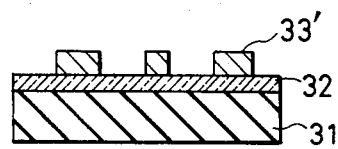
Figure 3C:
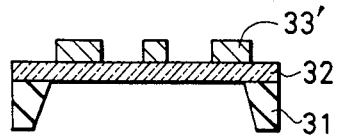

FIGS. 3a, 3b, and 3c shows a process for forming a soft X-ray absorbing pattern. A thin film 32 made of BN (boron nitride) is formed on a silicon wafer 31, and a peroxopolytungsten film 33 having a thickness of about 1.0 $\mu$m is formed thereon by spin-coating. Thereafter, the resulting material was heat-treated in an atmosphere of nitrogen or air having a temperature of 140° C. for 10 minutes to cure the polytungsten film 33. The cured polytungsten film 33 is irradiated with electron beams 34 of 50 $\mu$C/cm$^2$ to form therein denatured portions 33' (FIG. 3a). Subsequently the silicon wafer 31 is dipped in an aqueous solution of tetramethylammonium hydroxide to dissolve portions other than the denatured portions for removal thereof (FIG. 3b). Thus, development is effected to form a transparent part for X-rays. In this way, a mask for X-ray lithography is formed (FIG. 3c). The mask is irradiated with a Nek characteristic X-rays with a wavelength of about 10 Å to measure the contrast of the X-ray absorbing pattern made of the above-mentioned cured polytungsten film. As a result, a contrast of as high as 8 can be obtained.

Example 2

Description will be given with reference to FIGS. 4a, 4b, 4c, and 4d.

Figure 4A:
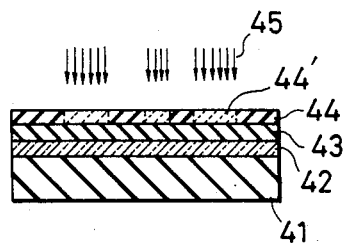
Figure 4B:
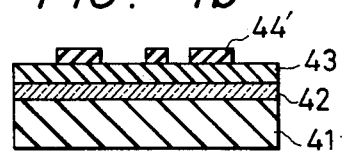
Figure 4C:
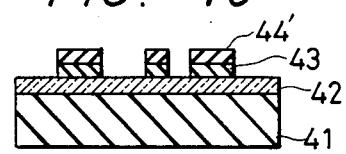
Figure 4D:
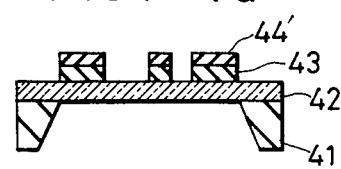

A BN film 42 is formed on a silicon substrate 41 in the same manner as in Example 1, and a gold film 43 having a thickness of 5,000 Å is deposited thereon by the vacuum evaporation technique, followed by application by spin-coating of a peroxopolytungsten film 44 of about 5,000 Å. In the same manner as described above, the resulting material is heat-treated in nitrogen at 140° C. for 10 minutes to heat-cure the above-mentioned polytungsten film 44. The cured film 44 is irradiated with electron beams to partially denature the same, whereby denatured portions 44' are formed (FIG. 4a). Thereafter, the cured film is developed with tetramethylammonium hydroxide in the same manner as above. The denatured portions 44' remain (FIG. 4b). The lower gold film 43 is etched with an aqueous solution of hydrofluoric acid-ammonium fluoride to form a two-layer X-ray absorbing pattern consisting of the cured polytungsten film and the gold film (FIG. 4c). Finally, the silicon substrate 41 is perforated to remove the middle portion thereof, whereby a transparent part for X-rays is formed (FIG. 4d).

The contrast for Nek characteristic X rays ($\lambda \approx 10$ Å) was examined in the same manner as in Example 1 to find a value of 12.

Example 3

The same procedures as in Examples 1 and 2 can be respectively performed using compositions as listed in Table 1 as peroxopolytungsten compounds other than that used in Examples 1 and 2.

Although various properties such as sensitivity, covering factor, and solubility differ from composition to composition, the contrast for X-rays is 8 or more in every case, substantiating the usability of the product as a mask for X-ray lithography.

The foregoing examples can be practiced with the above-mentioned compounds having thicknesses within a range of 0.2 to 5 μm.

TABLE 1

| Sample No. | W | Nb | Ti | Cr | Mo | Re | V | Ta | |
|---|---|---|---|---|---|---|---|---|---|
| No. 1 | 100 | — | — | — | — | — | — | — | Ex. 1 and 2 |
| 2 | 50 | 50 | — | — | — | — | — | — | |
| 3 | 50 | 30 | — | — | 20 | — | — | — | |
| 4 | 10 | 10 | 10 | 10 | 10 | 20 | 10 | 20 | |
| 5 | 10 | 20 | — | — | 30 | — | — | — | |
| 6 | 50 | — | — | — | 50 | — | — | — | |
| 7 | 70 | 30 | — | — | — | — | — | — | |
| 8 | 80 | 20 | — | — | — | — | — | — | |
| 9 | 90 | 10 | — | — | — | — | — | — | |

What is claimed is:

1. A mask for X-ray lithography comprising a thin film capable of transmitting soft X-rays and a pattern formed thereon and made of a material hardly capable of transmitting soft X-rays, wherein at least part of said material hardly capable of transmitting soft X-rays is a heat-cured product of a peroxopolytungsten compound containing at least tungsten as a heavy metal.

2. A mask for X-ray lithography as claimed in claim 1, wherein said peroxopolytungsten compound is peroxopolytungsten.

3. A mask for X-ray lithography as claimed in claim 1, wherein said peroxopolytungsten compound contains heavy metals consisting of 10% or more of tungsten and the balance of at least one element selected from among Nb, Ti, Cr, Mo, Re, V, and Ta.

4. A process for producing a mask for X-ray lithography comprising (1) forming a first film made of a material capable of transmitting soft X-rays on a substrate, (2) coating a second film made of a material hardly capable of transmitting soft X-rays on said first film, at least a part of said material hardly capable of transmitting soft X-rays being a peroxopolytungsten compound containing at least tungsten as a heavy metal, (3) curing said second film by heating, (4) irradiating said cured second film with electron beams to form denatured portions, and (5) developing said second film irradiated with electron beams to form a pattern.

5. A process for producing a mask for X-ray lithography as claimed in claim 4, wherein said peroxopolytungsten compound is peroxopolytungsten.

6. A process for producing a mask for X-ray lithography as claimed in claim 4, wherein said peroxopolytungsten compound contains heavy metals consisting of 10% or more of tungsten and the balance of at least one element selected from the group consisting of Nb, Ti, Cr, Mo, Re, V and Ta.

* * * * *